United States Patent [19]

Kinoshita et al.

[11] Patent Number: 4,983,937
[45] Date of Patent: Jan. 8, 1991

[54] MAGNETOSTATIC WAVE BAND-PASS-FILTER

[75] Inventors: Yasuaki Kinoshita, Hachioji; Sadami Kubota; Shigeru Takeda, both of Kumagaya, all of Japan

[73] Assignees: Hitachi, Ltd.; Hitachi Metals, Ltd., both of Tokyo, Japan

[21] Appl. No.: 375,483

[22] Filed: Jul. 5, 1989

[30] Foreign Application Priority Data

Jul. 20, 1988 [JP] Japan .................. 63-179046

[51] Int. Cl.⁵ .................................... H01P 1/217
[52] U.S. Cl. .................. 333/202; 333/219.2; 333/204
[58] Field of Search .............. 333/219, 219.2, 201, 333/202, 204, 205, 235, 246

[56] References Cited

U.S. PATENT DOCUMENTS

| | | | |
|---|---|---|---|
| 4,743,874 | 5/1988 | Kinoshita et al. | 333/219 |
| 4,751,480 | 6/1988 | Kunz et al. | 333/219.2 |
| 4,777,462 | 10/1988 | Kunz et al. | 333/219 |
| 4,782,312 | 11/1988 | Chang et al. | 333/219 |

FOREIGN PATENT DOCUMENTS 0966798 10/1982 U.S.S.R. .................. 333/219

OTHER PUBLICATIONS

Chang et al. "The Effect of Width Modes on the Performance of MSSW Resonators", 1984 Ultrasonic Symposium, pp. 164–167.
Castera et al., "Magnetostatic Surface Wave Oscillators and Resonators", Proceedings of the 8th European Microwave Conf. pp. 658–662, Sep. 1978.

Primary Examiner—Eugene R. LaRoche
Assistant Examiner—Seung Ham
Attorney, Agent, or Firm—Antonelli, Terry, Stout & Kraus

[57] ABSTRACT

A magnetostatic wave band-pass-filter is disclosed which uses a planar structure, it has, a single crystal thin film formed on a single crystal gadolinium gallium garnet substrate and mainly containing yttrium iron garnet. In this band-pass-filter, input and output electrodes each made up of finger electrodes and pad electrodes are formed on the substrate or thin film, a high-frequency signal is applied to the input electrode, to excite a magnetostatic wave in the thin film, the magnetostatic wave is reflected from parallel straight edges of the thin film, to generate resonance, and a high-frequency current excited by the magnetostatic wave is taken out by the output electrode.

8 Claims, 5 Drawing Sheets

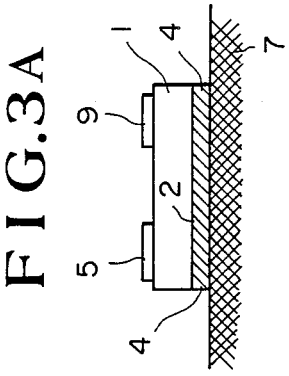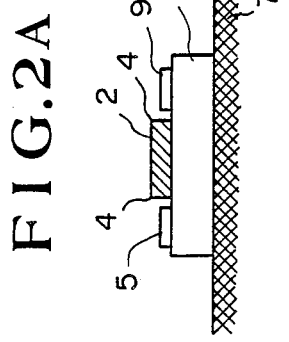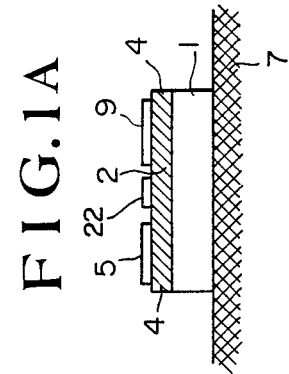

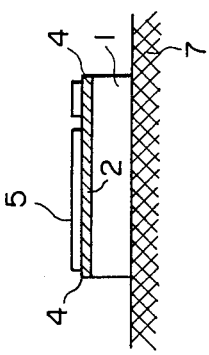
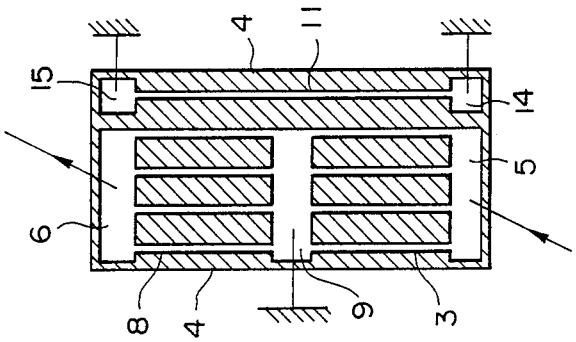
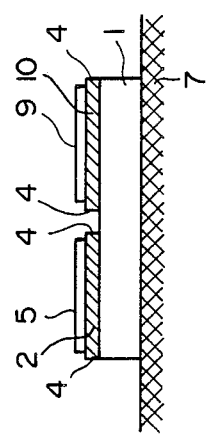
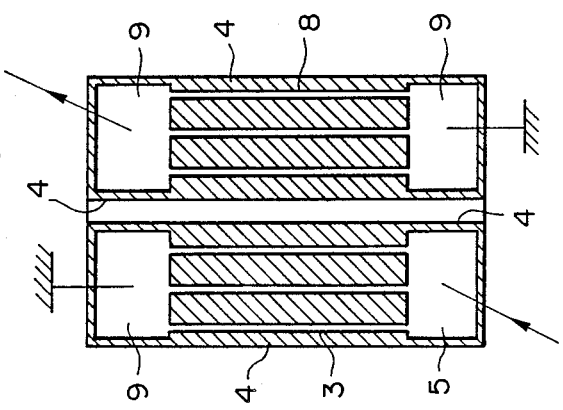
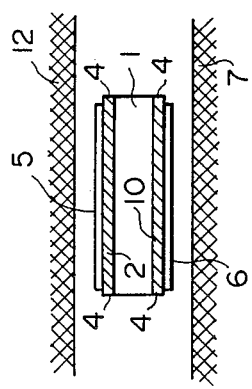
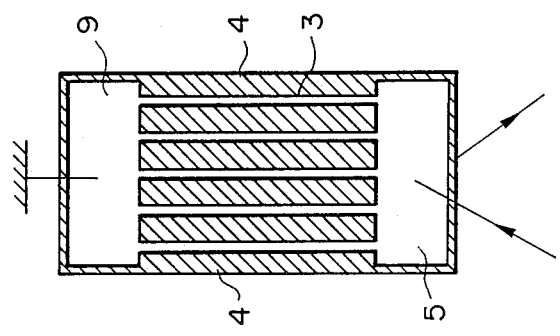

4,983,937

MAGNETOSTATIC WAVE BAND-PASS-FILTER

BACKGROUND OF THE INVENTION

The present invention relates to a magnetostatic wave band-pass-filter. In more detail, the present invention relates to a magnetostatic wave tunable band-pass-filter utilizing the ferromagnetic resonance of yttrium iron garnet (hereinafter referred to as "YIG"), and more particularly to a magnetostatic wave band-pass-filter having a planar structure with an electrode pattern formed, by photolithography, on a YIG film epitaxially grown on a gadolinium gallium garnet single crystal substrate (hereinafter referred to as "GGG substrate").

A conventional magnetostatic band-pass-filter utilizing ferromagnetic resonance of a YIG film is described in an article entitled "THE EFFECT OF THE WIDTH MODES ON THE PERFORMANCE OF MSSW RESONATORS" (IEEE Ultrasonics Symposium, 1984, pages 164 to 167). This band-pass-filter has the structure shown in FIGS. 9A and 9B of the accompanying drawings. That is, a YIG film 4 is grown on a single crystal GGG substrate 1 by liquid phase epitaxy. A chip resonator is cut out from the GGG substrate coated with the YIG film. An input microstrip electrode 3 and an output microstrip electrode 8 are formed on a microstrip substrate made up of a lower conductor 7 and a dielectric plate 13. The YIG film of the chip resonator is fixed to the microstrip substrate by an adhesive agent so that the distance between the input microstrip electrode and one of a pair of reflecting end faces of the YIG film is equal to the distance between the output microstrip electrode and the other reflecting straight edge of the YIG film. Incidentally, a band-elimination-filter (BEF) proposed by the present inventors and having a planar structure is disclosed in U.S. Pat. No. 4,743,874.

SUMMARY OF THE INVENTION

In order to fabricate a conventional magnetostatic wave band-pass-filter, it is required to arrange the chip resonator between an input microstrip electrode and an output microstrip electrode so that a pair of reflecting straight edges of the YIG film of the chip resonator are parallel to the input and output microstrip electrodes and the distance between the input microstrip electrode and one of the reflecting edges is equal to the distance between the output microstrip electrode and the other reflecting edge, and to fix the chip resonator thus positioned, to the microstrip substrate. Hence, conventional band-pass-filters have low mass-productivity and reproducibility.

Further, the conventional band-pass-filter has simple resonance response characteristics, and the above-referred article pays no attention to a method of synthesizing high-grade response characteristics.

It is accordingly an object of the present invention to provide a magnetostatic wave band-pass-filter which has a planar structure, that can be realizable by using photolithography, and moreover is extended to form a band-pass-filter of the multi-stage resonance type having high-grade response characteristics.

In order to attain the above object, according to the present invention, a resonator is formed of a YIG film which is grown on a single crystal GGG substrate by liquid phase epitaxy. The input and output finger electrodes for the resonator are formed on (1) the YIG film, (2) the exposed surface of the GGG substrate obtained by etching off part of the YIG film, or (3) the rear surface of the GGG substrate where the YIG film is not grown, in such a manner that the input and output finger electrodes are parallel to a pair of reflecting end faces of the YIG film and the distance between the input finger electrode and one of the reflecting edges is equal to the distance between the output finger electrode and the other reflecting edge.

In more detail, according to an aspect of the present invention, there is provided a magnetostatic wave band-pass-filter which comprises: a single crystal gadolinium gallium garnet substrate; a single crystal thin film of yttrium iron garnet epitaxially grown on the substrate, and the thin film having a pair of parallel edges. An input electrode is formed on the thin film having a finger electrode parallel to the edges of the thin film and a pair of pad electrodes. The pad electrodes being formed at both ends of the finger electrode, one of the pad electrodes being grounded, a high-frequency signal being applied to the other pad electrode, to excite a magnetostatic wave in the thin film. The magnetostatic wave being reflected from the edges of the thin film, the reflected waves making a standing wave between the end faces, to generate a resonance by the standing wave. An output electrode is formed on the thin film and having a finger electrode parallel to the edges of the thin film and a pair of pad electrodes. The pad electrodes being formed at both ends of the finger electrode, to take out high-frequency current excited by the magnetostatic wave. A magnetic field generating means is provided for applying a bias magnetic field to the thin film.

According to another aspect of the present invention, there is provided a magnetostatic wave band-pass-filter which comprises: a single crystal gadolinium gallium garnet substrate; and a single crystal thin film formed on the substrate by liquid phase epitaxicy of yttrium iron garnet, the thin film having a pair of parallel edges. An input finger electrode is formed on the substrate and has a finger electrode parallel to the edges of the thin film and a pair of pad electrodes, the pad electrodes being formed at both ends of the finger electrode. One of the pad electrodes being grounded and, a high-frequency signal being applied to the other pad electrode, to excite a magnetostatic wave in the thin film. The magnetostatic wave being reflected from the edges of the thin film, to generate a resonance by a standing wave. An output electrode is formed on the substrate and has a finger electrode parallel to the edges of the thin film and a pair of pad electrodes. The pad electrodes being formed at both ends of the finger electrode, to take out a high-frequency current excited by the magnetostatic wave. Magnetic field generating means is provided for applying a bias magnetic field to the thin film.

Further, a magnetostatic wave band-pass-filter according to the present invention is suited to form a band-pass-filter of the multi-stage resonance type. That is, a plurality of YIG resonators can be formed on a single crystal GGG substrate in such a manner that adjacent resonators are spaced apart from each other a predetermined distance, to be electrostatically coupled, or adjacent resonators are isolated from each other but coupled with each other by an additional finger electrode.

According to the present invention, a magnetostatic wave band-pass-filter can be fabricated in such a manner that a multiplicity of input and output electrode pairs are formed on a YIG film grown on a GGG substrate. Such an assembly is separated into a multiplicity of chips so that each chip has a pair of input and output electrodes, a pair of edges of the YIG film of each chip are made parallel to the input and output electrodes, and the distance between the input electrode and one of the edges is equal to the distance between the output electrode and the other end face. Alternatively, a magnetostatic wave band-pass-filter can be fabricated in the following manner. A YIG film grown on a GGG substrate is etched through photolithographic techniques so that a multiplicity of rectangular YIG films are left. Unetched, input and output electrodes are formed on both sides of each rectangular YIG film by a mask alignment method so that the input and output electrodes are made parallel to a pair of edges of the rectangular YIG film and the distance between the input electrode and one of the edges is equal to the distance between the output electrode and the other edge. The substrate having the YIG films and such an electrode pattern is separated into a plurality of chips so that each chip has one rectangular YIG film and a pair of input and output electrodes. In either case, a multiplicity of magnetostatic wave band-pass-filters can be fabricated in a relatively short time.

Further, according to the present invention, a plurality of YIG film resonators can be readily formed on a GGG substrate, and adjacent YIG film resonators are electrically coupled with each other, or coupled with each other by the aid of a current flowing through the additional finger electrode. Thus, the frequency characteristics of a band-pass-filter of the multistage resonance type based upon electric circuit theory can be realized by a plurality of YIG film resonators according to the present invention.

BRIEF DESCRIPTION OF THE DRAWINGS

FIGS. 1A, 2A and 3A are side views showing three embodiments of a magnetostatic wave band-pass-filter according to the present invention;

FIGS. 1B, 2B and 3B are plan views of the embodiments of FIGS. 1A, 2A and 3A, respectively;

FIGS. 5A, 6A and 7A are side views showing three embodiments of a magnetostatic wave band-pass-filter of the multi-stage resonance type according to the present invention;

FIGS. 5B, 6B and 7B are plan views of the embodiments of FIGS. 5A, 6A and 7A, respectively;

DETAILED DESCRIPTION OF THE PREFERRED EMBODIMENTS

Figure 4:
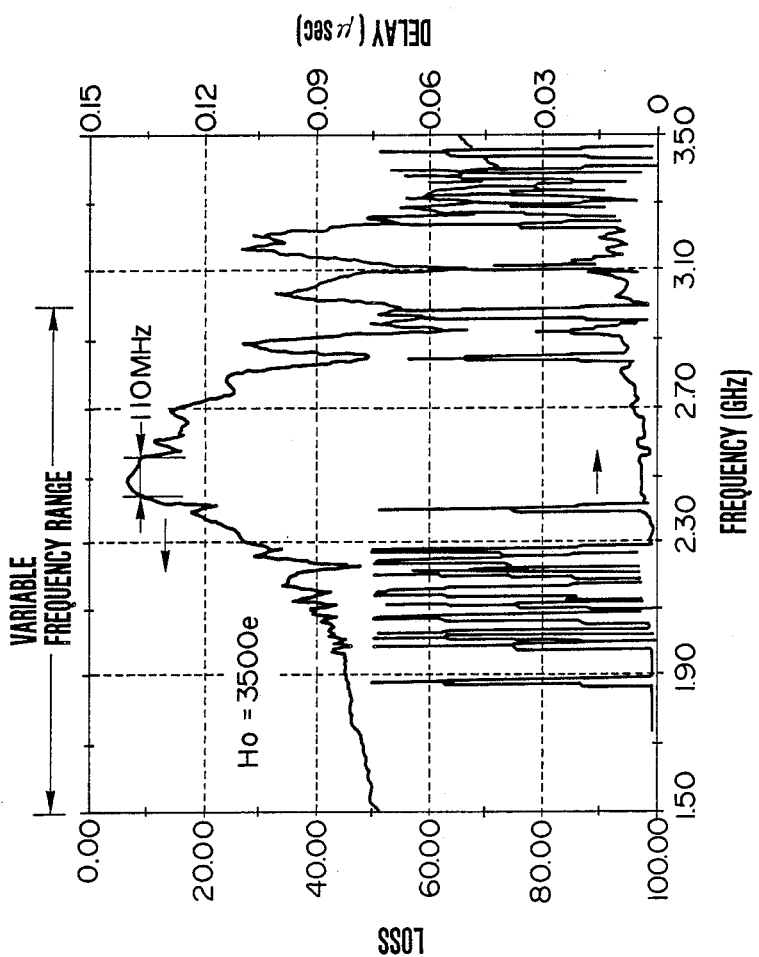
FIG. 4 is a graph showing the frequency characteristics of the embodiment of FIGS. 1A and 1B which were obtained by measurement.

Now, explanation will be made of an embodiment of a magnetostatic wave band-pass-filter according to the present invention, with reference to FIGS. 1A and 1B. Referring to FIGS. 1A and 1B, a thin YIG film 2 having a thickness of 40 $\mu$m is grown, by liquid phase epitaxy, on a single crystal GGG substrate 1 having a thickness of 500 $\mu$m, and an aluminum layer is deposited on the thin YIG film 2 to a thickness of 1 $\mu$m. The aluminum layer is etched using photolithographic techniques so that finger electrodes 3 and 8, and pad electrodes 5, 6 and 9 are left unetched. Each of the finger electrodes 3 and 8 has a width of 30 $\mu$m and a length of 3 mm, and each of the pad electrodes 5, 6 and 9 has a width of 1 mm. Then, the substrate 1 having the thin film 2 and the electrodes is cut so as to form a chip having dimensions of 2 mm $\times$ 5 mm. Thus, straight edges 4 of the thin film 2 are formed. The pad electrodes 9 are connected directly to a lower conductor 7 which is a ground conductor. Further, a bias magnetic field is applied to the thin film 2, and a high-frequency electric signal is applied between the pad electrode 5 and the ground conductor 7 to excite a magnetostatic wave in the thin film 2. The magnetostatic wave is reflected from each of the edges 4, and so a standing wave is formed to generate a resonance. An electric signal excited by the magnetostatic wave is taken out between the pad 6 and the ground conductor 7, to be used as the output of band-pass-filter.

FIG. 4 shows an example of the frequency characteristics of the embodiment of FIGS. 1A and 1B measured by the scattering matrix element $S_{21}$. As shown in FIG. 4, a band width of 110 MHz and a variable frequency range of about one octave are obtained In this case, a bias magnetic field $H_o$ equal to 350 Oe is applied parallel to the end faces 4, so that resonance of a magnetostatic surface wave is generated. Even in a case where the bias magnetic field $H_o$ is applied perpendicular to the main surface of the thin film 2 to excite a forward volume wave, or the bias magnetic field $H_o$ is applied perpendicular to the end faces 4 to excite a backward volume wave, frequency characteristics similar to those shown in FIG. 4 can be obtained.

Referring back to FIG. 1B, a finger electrode 20 lying halfway between the finger electrode 3 and the finger electrode 8 is provided to reduce the electrical coupling of the finger electrodes 3 and 8, thereby increasing the out-of-band rejection ability of the band-pass-filter (that is, present embodiment). The above finger electrode 20 has pad electrodes 22 at both ends, and these additional pad electrodes 22 are connected to the ground conductor 7. The present inventors did some experiments, to check whether or not the pad electrode 9 and one of the additional pad electrodes 22 can be united in one body. It was found that, especially in a case where a thin wire was used for connecting a pad electrode 9 and the ground conductor 7, the separation of the additional pad electrode 22 from the pad electrode 9 was superior in out-of-band rejection ability to the situation of a united connection of these pad electrodes 9 and 22.

The frequency characteristics of FIG. 4 show that the present embodiment can be approximated by an equivalent circuit that a series combination of an LC series resonance circuit (namely, a series resonance circuit made up of an inductor and a capacitor) and a transformer is connected between an input terminal and an output terminal.

FIGS. 2A and 2B show another embodiment of a magnetostatic wave band-pass-filter according to the present invention. The present embodiment is narrower in band width than the embodiment of FIGS. 1A and 1B, that is, has a band width less than 110 MHz. In the present embodiment, the finger electrodes 3 and 8 are spaced apart from the thin film 2, to weaken the coupling of the thin film 2 and each of the finger electrodes 3 and 8. In more detail, the thin YIG film 2 is locally etched off by a chemical etching method, to form the straight edges 4 of the unetched thin film 2, and the finger electrodes 3 and 8 and the pad electrodes 5, 6 and 9 are formed on that exposed surface of the substrate 1 where the thin YIG film has been etched off. In the present embodiment, a parasitic resonance mode of higher order can be suppressed by coating the thin film 2 with aluminum foil or forming a plurality of finger electrodes which are formed parallel to the finger electrodes 3 and 8 at regular equal intervals and are grounded. The suppression effect by the multiple fingers is shown in U.S. Pat. No. 4,743,874.

FIGS. 3A and 3B show a further embodiment of a magnetostatic wave band-pass-filter according to the present invention. In the present embodiment, the finger electrodes 3 and 8 and the pad electrodes 5, 6 and 9 are formed on the rear surface of the substrate 1 of FIG. 1A, to make the coupling of the thin film 2 and each finger electrode 3 or 8 weaker than that in the embodiment of FIGS. 2A and 2B, thereby more narrowing the band width.

FIGS. 5A, 5B, 6A, 6B, 7A and 7B show three embodiments of a magnetostatic wave band-pass-filter of the double resonance type, according to the present band-pass-filter invention which includes a pair of thin film resonators. Each of these embodiments can be approximated by an equivalent circuit having a pair of series resonance circuits each made up of an inductor and a capacitor connected in series through a transformer. In more detail, the embodiment of FIGS. 5A and 5B is fabricated in the following manner. Thin films 2 and 10 are grown on the main surfaces of the substrate 1 by liquid phase epitaxy. Then, the finger electrodes 3 or 8, the pad electrode 5 or 6, and the pad electrodes 9 are formed on each of the thin films 2 and 10. Thereafter, a chip having a desired size is cut out, to form the straight edges 4 of the thin films 2 and 10. The thin film resonators 2 and 10 formed on both sides of the substrate 1 are electrically coupled with each other, and thus a magnetostatic wave band-pass-filter of the double resonance type is obtained.

Figure 8:
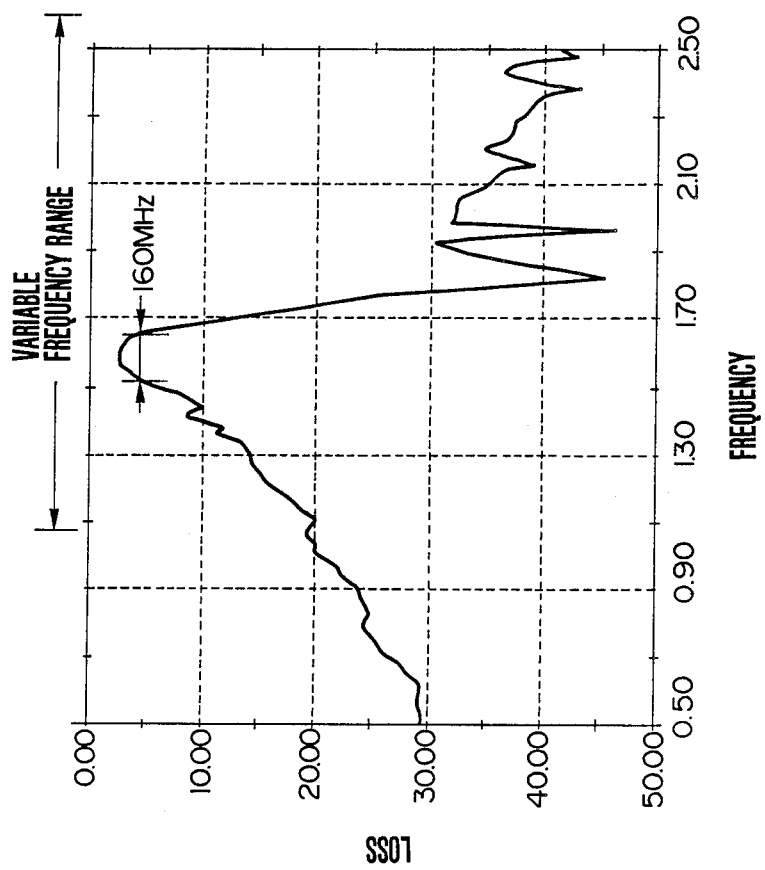
FIG. 8 is a graph showing the frequency characteristics of the embodiment of FIGS. 5A and 5B which were obtained by measurement; and, FIGS. 9A and 9B are plan and side views showing a conventional magnetostatic wave band-pass-filter.
Figure 9A:
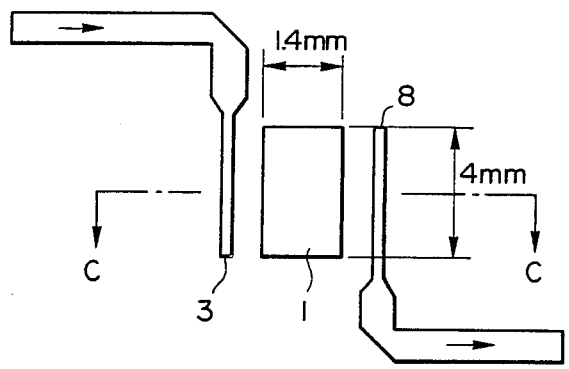
Figure 9B:
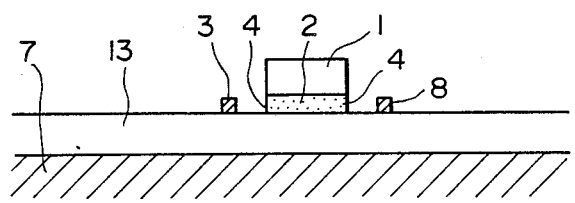

FIG. 8 shows the measured frequency characteristics of a band-pass-filter which is formed by electrically coupled two resonator chips each having dimensions of 2 mm×5 mm, and corresponds to the embodiment of FIGS. 5A and 5B. As shown in FIG. 8, a band width of 160 MHz and a variable frequency range of about one octave can be obtained. In the above case, a bias magnetic field is applied so that a magnetostatic surface wave is excited and reflected It is to be noted that the frequency characteristics of FIG. 8 is superior in the out-of-band rejection ability in the high frequency range to the frequency characteristics of FIG. 4.

In the embodiment of FIGS. 6A and 6B, two thin film resonators are formed on the same surface of the substrate 1, and are electrically coupled with each other. As shown in FIG. 6A, the thin film 2 is separated from the thin film 10 by a groove.

In the embodiment of FIGS. 7A and 7B, two resonators are formed on the same surface of the substrate 1 by the thin YIG film 2 and the edge 4 thereof. The resonators are coupled with each other by means of a coupling electrode 11 which is made up of a finger electrode and a pair of pad electrodes 14 and 15. It is to be noted that the finger electrode 3 is substantially isolated from the finger electrode 8 by the pad electrode 9.

Finally, explanation will be made of the effect of the ground conductor 7. When the thin films 2 and 10 are spaced apart from the ground conductor 7 a distance far longer than the thickness of the thin films 2 and 10, the ground conductor 7 has little effect on the frequency dispersion characteristics of the above-mentioned embodiments. The ground conductor 7 is disposed so that the surface of the conductor 7 is parallel to the thin film 2, in order to hold a thin film resonator. Accordingly, it is necessary to design an electrode pattern so that the frequency dispersion effect is taken into consideration.

In many cases, the ground conductor 7 is bonded to the substrate 1 or the thin film 2 as shown in FIGS. 1A, 2A, 3A, 6A and 7A. In the case shown in FIGS. 5A and 5B, however, the distance between the thin film 2 and the conductor 7 differs from the distance between the thin film 10 and the conductor 7. In this case, another ground conductor 12 is also disposed over the thin film 2 so that the distance between the thin film 2 and the conductor 12 should be equal to the distance between the thin film 10 and the conductor 7, in order to ease the electrode pattern design.

The pad electrode 9 is connected to the ground conductor 7 by a thick bond wire so that the length of the wire is made as small as possible to reduce the wire inductance. Alternatively, the pad electrode 9 may be connected to the ground conductor 7 by a conductor belt or a plurality of bond wires. It is needless to say that the out-of-band rejection ability is increased by reducing the bond wire inductance. Further, the pad electrodes 5 and 6 should be connected to input and output terminals, respectively, in a similar manner, to reduce bond wire inductance.

As has been explained in the foregoing, according to the present invention, there is provided a frequency tunable band-pass-filter having a planar structure suitable for use in an integrated circuit. In other words, according to the present invention, the time necessary for accurately fitting input and output electrodes in relation to a magnetostatic wave resonator can be greatly saved by using photolithography and a wafer saw process. Further, a band-pass-filter according to the present invention can be easily connected to an active integrated circuit. In addition, according to the present invention, there is provided a frequency tunable band-pass-filter of the multi-stage resonance type which includes a plurality of magnetostatic wave resonators and has high-grade response characteristics.

We claim:

1. A magnetostatic wave band-pass-filter comprising:
   a single crystal gadolinium gallium garnet substrate;
   a single crystal thin film formed on said substrate and mainly containing yttrium iron garnet, said thin film having a pair of parallel edges;
   an input electrode formed on said thin film and having at least one finger electrode parallel to the edges of said thin film and a pair of pad electrodes, said pad electrodes being formed at both ends of said finger electrode, one of said pad electrodes being grounded, a high-frequency input signal being applied to the other pad electrode, to excite a magnetostatic wave in said thin film, said magnetostatic wave being reflected from the edges of the thin film, to generate resonance;
   an output electrode formed on said thin film and having at least one finger electrode parallel to the edges of said thin film and a pair of pad electrodes, said pad electrodes being formed at both ends of said finger electrode, one of said pad electrodes being grounded, and the other of said pad electrodes connected to take out a high-frequency output signal current excited by said magnetostatic wave;

magnetic field generating means for applying a bias magnetic field to said thin film; and wherein the total number of said finger electrodes is three or more.

2. A magnetostatic wave band-pass-filter according to claim 1, further comprising a decoupling electrode formed between said input electrode and said output electrode, said decoupling electrode has at least one finger electrode and a pair of pad electrodes formed at both ends of said finger electrode, said pad electrodes being grounded, wherein the total number of said finger electrodes is three or more.

3. A magnetostatic wave band-pass-filter according to claim 1, wherein said finger electrode of said input electrode is in alignment with said finger electrode of said output electrode so that said input and output electrodes have a grounded pad electrode in common, and a coupling electrode having at least one finger electrode parallel to said finger electrodes of said input and output electrodes is additionally formed, and a pair of pad electrodes are formed at both ends of said finger electrode of said coupling electrode and are grounded, wherein the total number of said finger electrodes is three or more.

4. A magnetostatic wave band-pass-filter according to claim 1, wherein two thin films are formed on said single crystal gadolinium gallium garnet substrate, and said input electrode is formed on one of said thin films, and said output electrode is formed on said other thin film.

5. A magnetostatic wave band-pass-filter according to claim 4, wherein said thin films are formed on the same surface of said single crystal gadolinium gallium garnet substrate.

6. A magnetostatic wave band-pass-filter according to claim 4, wherein said thin films are formed on different surfaces of said single crystal gadolinium gallium garnet substrate.

7. A magnetostatic wave band-pass-filter comprising:
a single crystal gadolinium gallium garnet substrate;
a single crystal thin film formed on said substrate and mainly containing yttrium iron garnet, said thin film having a pair of parallel edges;
an input electrode formed on said substrate and positioned on one side of said thin film, and input electrode having a finger electrode parallel to the edges of said thin film and a pair of pad electrodes, said pad electrodes being formed at both ends of said finger electrode, one of said pad electrodes being grounded, a high-frequency input signal being applied to said other pad electrode, to excite a magnetostatic wave in said thin film, said magnetostatic wave being reflected from the edges of said thin film, to generate resonance;
an output electrode formed on said substrate and positioned on the opposite side of said thin film from said input electrode, said output electrode having a finger electrode parallel to the edges of said thin film and a pair of pad electrodes, said pad electrodes being formed at both ends of said finger electrode, one of said pad electrodes being grounded, and the other of said pad electrodes connected to take out a high-frequency output signal current excited by said magnetostatic wave;
at least one finger electrode formed on said thin film, said electrode being grounded;
magnetic field generating means for applying a bias magnetic field to said thin film;
wherein the total number of finger electrodes is three or more.

8. A magnetic wave band-pass-filter according to claim 7, wherein said finger electrode on said thin film is a thin conducting film.

* * * * *